United States Patent
Su

(10) Patent No.: US 8,575,640 B2
(45) Date of Patent: Nov. 5, 2013

(54) POLARIZED WHITE LIGHT EMITTING DIODE

(75) Inventor: Jung-Chieh Su, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 0 days.

(21) Appl. No.: 13/541,809

(22) Filed: Jul. 5, 2012

(65) Prior Publication Data

US 2013/0015482 A1 Jan. 17, 2013

(30) Foreign Application Priority Data

Jul. 14, 2011 (TW) .............................. 100124924 A

(51) Int. Cl.
*H01L 33/00* (2010.01)
(52) U.S. Cl.
USPC .................. 257/98; 257/81; 257/84; 257/99; 257/432; 438/27; 438/29; 438/65; 438/99
(58) Field of Classification Search
USPC ........ 257/E33.068, 98, 79, 80, 81, 82, 84, 89, 257/99, 431, 432, 433, 666, 734, 678, 690, 257/704, 684; 438/FOR. 453, FOR. 416, 438/FOR. 287, FOR. 157, 22, 25, 26, 27, 29, 438/24, 28, 48, 69, 65
See application file for complete search history.

(56) References Cited

U.S. PATENT DOCUMENTS

2012/0256217 A1* 10/2012 Li et al. .......................... 257/98

\* cited by examiner

*Primary Examiner* — Thanh Y Tran
(74) *Attorney, Agent, or Firm* — Bacon & Thomas, PLLC

(57) ABSTRACT

A polarized white light emitting diode provides a polarized white light to decrease glare, and increase the extinction ratio. A LED chip is disposed in a cavity between a reflection substrate and a metallic wire-grid polarizing layer, and emits a first color light. The metallic wire-grid polarizing layer is disposed under and in contact with a transparent substrate. A phosphor layer covers over the LED chip, and is disposed in the cavity with an air gap between the phosphor layer and the metallic wire-grid polarizing layer. A second color light is generated by the first color light. The metallic wire-grid polarizing layer multiply reflects a portion of first color light in plural directions in the cavity to produce secondary excitations. The polarized white light transmits through the metallic wire-grid polarizing layer by mixing a portion of first color light with the second color light excited by the first color light.

18 Claims, 7 Drawing Sheets

POLARIZED WHITE LIGHT EMITTING DIODE

BACKGROUND OF THE INVENTION

1. Field of the Invention

The invention relates to a white light emitting diode, and especially relates to a polarized white light emitting diode.

2. Description of the Prior Art

A white light emitting diode (LED) is formed by plural color light emitting diode chips. Another white light emitting diode (LED) is mostly formed by multiple color phosphor powders and one of the blue light emitting diode chip and the ultraviolet light emitting diode chip.

Though the first white LED formed by plural color light emitting diode chips has the capability for the adjustable color light, the different materials of plural color light emitting diode chips could make the color temperature rise up following the varied color and the hard mixing of the color light and etc. The disadvantages of the white LED formed by multiple color phosphor powders and the ultraviolet light emitting diode chip are the insufficient illumination and causing damage due to the ultraviolet light. Therefore, said white LED must be to improve the emitting efficiency thereof and to add an optical unit thereon for avoid the ultraviolet light emitting outward.

The white LED is predominantly formed by the blue light emitting diode chip and the yellow phosphor powder, wherein the white light is emitted by mixing the blue light with the yellow light generated by the yellow phosphor powder excited by the blue light. However, the intensity of the blue light is larger than the intensity of the yellow light in the mixing process of said white LED, so the disadvantage of said white LED are high color temperature and glare caused, so the color rendering is unable to rise to 80 and the illumination and the color are not uniform to produce yellow circle phenomenon. Otherwise, the wave of the blue light emitted from the blue LED increases following the operation temperature, so the color of the white light by mixing the blue light and the yellow light is varied.

However, the white light, which is emitted by said white LEDs, is non-polarized. In illumination application, the non-polarized light causes glare so user feels uncomfortable as reading under the non-polarized light. How to make the white light emitted from the white LED polarize, own high extinction ration and decrease glare is an urgent problem in the field.

Moreover, the current liquid crystal display (LCD) is mainly composed of a liquid crystal layer, a substrate, a back-lighting device, two polarizing sheets and a filter. The non-polarized white light emitted by the white LED is used as the light source of the back-lighting device and is polarized by polarizing sheets, so the polarized white light produces the spatial light modulation as penetrating through the liquid crystal layer and the LCD could work. The polarized white light directly emitted from the white LED can increase the illumination and reduce the usage of the polarizing sheets so as to decrease cost.

For making the white light emitted from the white LED polarize, there are four prior arts described as below. The prior art (U.S. Pat. No. 7,091,661) teaches a LED chip, a phosphor powder and a reflective polarizer. The phosphor powder is placed above the LED chip and between two polymer filters. The reflective polarizer is placed above the phosphor powder. A first light emitted from the white LED enters the phosphor powder through the polymer filter, and a second light is excited. The light formed by mixing the first light and the second light is emitted from another polymer filter and goes through the reflective polarizer, so a polarized light is generated. Said reflective polarizer is a polarizing multi-sheets or an absorptive polarizing sheet. Another prior art (U.S. Pat. No. 7,766,495) teaches a reflective cover placed above a LED chip, so the light emitted from the LED chip is reflected by the reflective cover to one direction and a polarized light is outputted.

Another prior art (U.S. Pat. No. 7,339,736) teaches a reflective polarized multi-sheets made from polymer and placed above a non-polarized light. A polarized is formed by the non-polarized light going through the reflective polarized multi-sheets, so can be used for the back-lighting device of the LCD to increase the illumination. However, the reflective polarized multi-sheets made from polymer is easy exhaustion in the operation due to the high operation temperature and the exposure under the ultraviolet light. Thus, how to make the reflective polarized multi-sheets durable is another urgent problem in the field.

Another prior art (U.S. Pat. No. 7,614,757) teaches a reflective metallic wire-grid polarizer used for the back-lighting device of the LCD to increase the illumination. The reflective metallic wire-grid polarizer is made of plural nanometer metallic wire array placing on the a transparent substrate, and the advantages thereof are wide range of the operation wave, high extinction ratio, large light radiation angle and great durable level. However, the nanometer structure of the reflective metallic wire-grid polarizer is easy-damaged, so how to protect the reflective metallic wire-grid polarizer is another urgent problem in the field.

SUMMARY OF THE INVENTION

Accordingly, the object of the invention is to provide a polarized white light emitting diode for increasing the extinction ratio thereof, decreasing the color temperature thereof, retarding the variation of the color thereof, and further improving the uniformity thereof. Otherwise, the polarized white light emitting diode can be useful for the back-lighting of the liquid crystal displays (LCDs) to increase the illumination and to decrease the usage of the polarizing sheet so as to solve the exhaustion of the polarizing sheet.

In one aspect, the invention provides a polarized white light emitting diode, including a reflection substrate, a transparent substrate, a metallic wire-grid polarizing layer, a light emitting diode chip and a phosphor layer. The transparent substrate has a first surface and a second surface opposing the first surface. The metallic wire-grid polarizing layer is disposed under the transparent substrate and contacts therewith. And the metallic wire-grid polarizing layer and the reflection substrate form a cavity. The light emitting diode chip is disposed in the cavity for providing a first color light. The phosphor layer covers over and around the LED chip, and is disposed in the cavity with an air gap between the phosphor layer and the metallic wire-grid polarizing layer.

A second color light is generated by the phosphor layer excited with the first color light as penetrating through the phosphor layer.

The phosphor layer is formed by mixing a transparent glue with at least one phosphor powder, and the phosphor powder is a yellow phosphor powder. Moreover, the phosphor powders include the yellow phosphor powder and one of a red phosphor powder and a green phosphor powder. The first color light is a blue light, and the second color light is a yellow light. Furthermore, the second color light includes the yellow light and one of a red light and a green light.

The metallic wire-grid polarizing layer faces downward to the phosphor layer and not contacts the phosphor layer with an air gap. The metallic wire-grid polarizing layer multiply reflects a portion of the first color light in plural directions in the cavity to produce secondary excitations; a polarized white light transmits through the metallic wire-grid polarizing layer by mixing another portion of the first color light and the second color light excited by the first color light. The transparent substrate is disposed above the metallic wire-grid polarizing layer. The first surface contacts the metallic wire-grid polarizing layer, and the polarized white light is transmitted through the second surface of the transparent substrate.

In an embodiment, a secondary optical unit disposed on the second surface of the transparent substrate Wherein the secondary optical unit is such as a micro-lens, an optical film or an optical grating.

In an embodiment, the first color light includes a transverse magnetic wave and a transverse electric wave. The transverse electric wave is multiply reflected in plural directions by the metallic wire-grid polarizing layer between the phosphor layer and the air gap, and the polarized white light transmits through the metallic wire-grid polarizing layer by mixing the transverse magnetic wave with the second color light excited by the first color light.

In an embodiment, the reflection substrate has a bottom and four walls, so a concave is formed by the bottom and the walls. The light emitting diode chip is disposed above the bottom, and the phosphor layer covers the light emitting diode chip and is disposed in the concave. Therefore, the transverse electric wave is multiply reflected in the cavity for polarization randomization.

In an embodiment, the reflection substrate has a first concave, a second concave connected with the first concave and a transparent layer. The first concave is disposed below the second concave, and the light emitting diode chip is disposed in the first concave. The transparent layer is spread around the light emitting diode chip and the first concave is filled with the transparent layer. The phosphor layer covers the transparent layer and is disposed in the second concave, so the transverse electric wave is multiply reflected in the cavity for polarization randomization.

In an embodiment, the air gap includes a medium, and the medium is partially or full filled in the air gap. Wherein the reflective index of the medium is between 1 and 1.4, and is smaller than the reflective index of the phosphor layer.

In an embodiment, the metallic wire-grid polarizing layer and the transparent substrate are integrated. The metallic wire-grid polarizing layer includes plural metallic wires, and the metallic wires are parallel disposed on the first surface of the transparent substrate. The metallic wire-grid polarizing layer has a wire-grid period, and the wire-grid period is smaller than or equal to the 300 nanometer. The metallic wire-grid polarizing layer has a duty cycle ratio, and the duty cycle ratio is between 10% and 60%. The material of the metallic wire-grid polarizing layer is selected from the group consisting of Al, W, Cu, Ag and Au.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
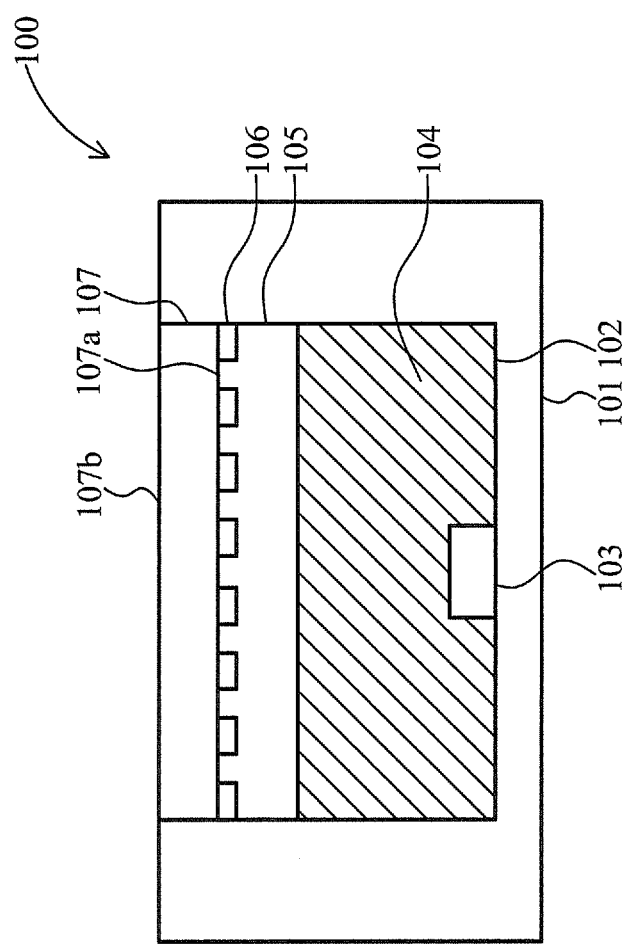
FIG. 1 is a schematic view of the polarized white light emitting diode of a first embodiment of the invention.

Refer to FIG. 1 for a schematic view of a polarized white light emitting diode of a first embodiment of the invention. The polarized white light emitting diode 100 includes a reflection substrate 101, a light emitting diode chip 103, a phosphor layer 104, a metallic wire-grid polarizing layer 106 and a transparent substrate 107.

The reflection substrate 101 has a bottom and four walls, so a concave is formed by the bottom and the walls. The light emitting diode chip 103 is disposed above the bottom of the reflection substrate 101, and a circuit (without drawn) is formed on reflection substrate 101 so the light emitting diode chip 103 is electrically connected with circuit. The light emitting diode chip 103 is driven by external current to emit a first color light and further provide the first color light for exciting the phosphor layer 104. Wherein the first color light has a transverse electric wave (TE wave) and a transverse magnetic wave (TM wave). In this embodiment, the first color light is a blue light.

A reflective layer 102 is disposed on the bottom and four walls of the reflection substrate 101 and is placed around the interior concave. In an embodiment, the light emitting diode chip 103 is a blue light emitting diode chip, which is emitting a blue light with the wavelength between 400-530 nm, and the blue light emitting diode chip 103 is a III-V semiconductor chip such as GaN, InGaAlN, and AlGaN. Moreover, there are plural blue light emitting diode chips 103 on the reflection substrate 101 with different arrangements so as to provide several illuminations.

The phosphor layer 104 covers over and around the light emitting diode chips 103 and is disposed in the concave of the reflective substrate 101, so the reflective layer 102 is around the phosphor layer 104. Wherein the phosphor layer 104 is formed by mixing a transparent glue with at least one phosphor powder, and the phosphor powder is a yellow phosphor powder. Moreover, the phosphor powders include the yellow phosphor powder and one of a red phosphor powder and a green phosphor powder, so several second color lights are generated by exciting the different phosphor powders with the first color light as penetrating through the phosphor powders. The second color light is a yellow light. Furthermore, the second color light includes the yellow light and one of a red light and a green light. In this embodiment, the light emitting diode chip 103 is the blue light emitting diode chip, so the phosphor layer 104 is formed by mixing proper ratio of the yellow phosphor powder with a transparent glue, which is transparent as penetrated by the blue light, according to the wavelength range of the blue light. The transparent glue, which can be penetrated by the visible light, is an epoxy resin or a silica gel. The material of the yellow phosphor powder includes YAG, TAG, silicates with Eu or Ce, oxynitride, nitride, phosphates and etc.. The emitting wavelength of the blue light emitted from the blue light emitting diode 103 is between 400-530 nm, so the yellow phosphor powder of the phosphor layer 104 can be excited to emit the yellow light by a portion of the blue light. A white light is formed by mixing the rest blue light with the yellow light excited by the portion of the blue light.

The metallic wire-grid polarizing layer 106 faces downward to the phosphor layer 104 and not contacts the phosphor layer 104 with an air gap 105. The metallic wire-grid polarizing layer 106 includes plural metallic wires, the width of each metallic wire is between 30-180 nm, and the thickness of each metallic wire is between 30-200 nm. Because the size of the metallic wires of the metallic wire-grid polarizing layer 106 is fine, so the metallic wire-grid polarizing layer 106 is easy-damaged. For this reason, the air gap 105 is between the phosphor layer 104 and the metallic wire-grid polarizing layer 106, so the metallic wire-grid polarizing layer 106 does not contacts the phosphor layer 104 for avoiding damage and increasing the illumination. Wherein the air gap 105 includes a medium full filled therein, and the reflective index of the medium is between 1 and 1.4 and smaller than the reflective index of the phosphor layer 104.

The transparent substrate 107 is disposed above and in contact with the metallic wire-grid polarizing layer 106. The transparent substrate 107 has a first surface 107a and a second surface 107b opposing the first surface 107a. The first surface 107a contacts the metallic wire-grid polarizing layer 106. In other words, the metallic wires of the metallic wire-grid polarizing layer 106 are parallel disposed on the first surface 107a of the transparent substrate 107. The transparent substrate 107 has a high penetration coefficient so as to be penetrated by the white light emitted from the phosphor layer 104. The material of the transparent substrate 107 is such as glass or polymer.

Figure 2:
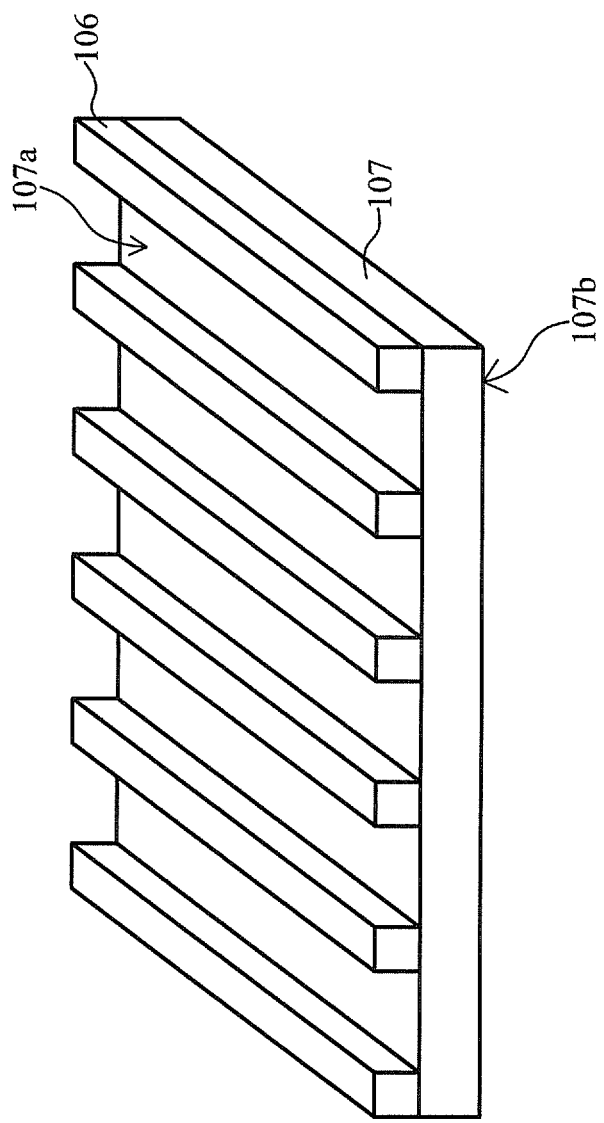
FIG. 2 is a schematic view of the metallic wire-grid polarizing layer of the invention.

Refer to FIG. 2 for a schematic view of the metallic wire-grid polarizing layer of the invention. The metallic wire-grid polarizing layer 106 and the transparent substrate 107 are integrated. The metallic wire-grid polarizing layer 106 has a wire-grid period, and the wire-grid period is smaller than or equal to the 300 nanometer. The metallic wire-grid polarizing layer 106 has a duty cycle ratio, and the duty cycle ratio is between 10% and 60%. The material of the metallic wire-grid polarizing layer 106 is selected from the group consisting of Al, W, Cu, Ag and Au. The manufacture methods of the metallic wires on the metallic wire-grid polarizing layer 106 includes nano-lithography, electron beam lithography, holographic lithography, nano-imprinting, and etc., so a photoresistor design with sub-wavelength strips is printed on the first surface 107a. In the following, a sub-wavelength grating is formed on the first surface 107a by lift-off or etching with deposition.

The sub-wavelength grating of the metallic wire-grid polarizing layer 106 has the capability of polarization, and can make the visible light such as the white light polarize and multiply reflect so as to generate a polarized white light. By the sub-wavelength grating of the metallic wire-grid polarizing layer 106, the white light emitting diode 100 not only emits the polarized white light but also illuminates uniformly, stabilizes the color of the white light and decreases the color temperature thereof. Otherwise, the width, the thickness and the material of the metallic wires and the sub-wavelength grating of the metallic wire-grid polarizing layer 106 can be designed for reflecting the certain wavelength of apportion of the first color light emitted from the light emitting diode chip 103.

The characteristics of the metallic wire-grid polarizing layer 106 are partial light reflection and partial light transmission, and the wide operation wavelength so as to polarize the white light with multi-wavelength. In an embodiment, the metallic wire-grid polarizing layer 106 has a polarization condition with the reflective ratio, which is larger than 95%, so can make the TM wave of the first color light be transmitted and the TE wave of the first color light be reflected.

The TE wave of the first color light is blocked by the metallic wire-grid polarizing layer 106 so is reflected by the first surface 107a; and the TM wave of the first color light transmits through the metallic wire-grid polarizing layer 106 and the second color light also transmits through. The first color emitted from the light emitting diode chip 103 is partially limited between the metallic wire-grid polarizing layer 106 and the reflection substrate 101 by the reflective layer 102, and the metallic wire-grid polarizing layer 106 and the reflection substrate 101 form a cavity. The metallic wire-grid polarizing layer 106 multiply reflects the TE wave of the first color light in plural directions between the phosphor layer 104 and the air gap 105, so the phosphor layer 104 is multiply excited by the TE wave of the first color light to produce secondary excitations and to generate the second color light following as polarization randomization. Until the TE wave of the first color light is transferred to the TM wave by the polarization randomization, the polarized white light transmits through the metallic wire-grid polarizing layer 106 by mixing the TM wave of the first color light with the second color light excited by the first color light, and the polarized white light is transmitted through the second surface of the transparent substrate.

Because the metallic wire-grid polarizing layer 106 has high reflective ratio for the TE wave of the first color light, the TE wave of the first color light is transferred to the TM wave by multiple reflection and the polarization randomization so as to transmit through the metallic wire-grid polarizing layer 106. For said repeat process, the extinction ration, the illumination, the polarization efficiency of the polarized white light emitting diode 100 are improved.

The light emitting diode chip 103 is disposed in the cavity formed by the metallic wire-grid polarizing layer 106 and the reflection substrate 101 for providing the first color light. The phosphor layer 104 covering over and around the LED chip 103 is disposed in the cavity with the air gap between the phosphor layer 104 and the metallic wire-grid polarizing layer 106. The cavity can make the first color light excite the phosphor powder of the phosphor layer 104. For this reason, the high color temperature caused by the rest first color light emitted from the light emitting diode 102 are solved. For the same reason, the excitation efficiency of the phosphor powder is improved so the more second color light is excited as well as the more polarized white light is generated the polarized white light emitting diode 100. The polarized white light enters the first surface 107a of the transparent substrate 107 and outputs from the second surface 107b.

In the package structure of the polarized white light emitting diode 100 of the first embodiment, the blue light emitting diode chip is used as the blue light emitting diode chip 103, the yellow powder is used in the phosphor layer 104 and the metallic wire-grid polarizing layer 106 is used therein, so the polarized white light is generated. For avoiding the nanometer structure of the metallic wires of the metallic wire-grid polarizing layer 106 damage, and for increasing the extinction ratio and the durable level of the polarized white light emitting diode 100, the metallic wire-grid polarizing layer 106 faces downward to the phosphor layer 104 and not contacts the phosphor layer 104 with the air gap 105.

Figure 3:
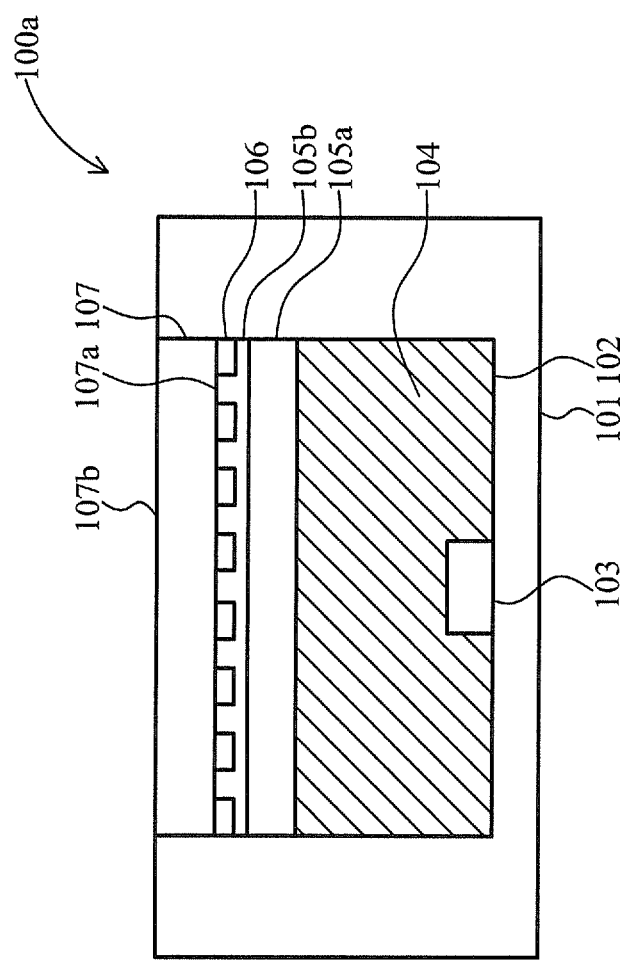
FIG. 3 is a schematic view of the polarized white light emitting diode of a second embodiment of the invention.

Refer to FIG. 3 for a schematic view of the polarized white light emitting diode of a second embodiment of the invention. The different structure between the polarized white light emitting diodes 100 and 100a is the air gap. The air gap 105 of the polarized white light emitting diodes 100 is replaced to an air gap 105b and a material 105a such as transparent gel in the polarized white light emitting diodes 100a. The reflective index of the medium 105b is between 1 and 1.4, and is smaller than the reflective index of the phosphor layer 104.

Figure 4:
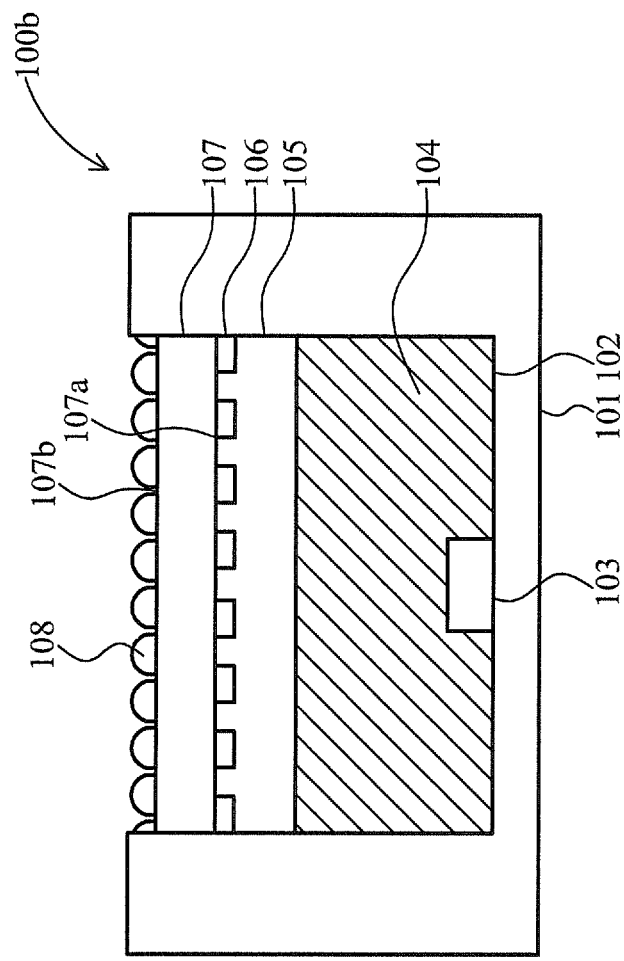
FIG. 4 is a schematic view of the polarized white light emitting diode of a third embodiment of the invention.

Refer to FIG. 4 for a schematic view of the polarized white light emitting diode of a third embodiment of the invention. A polarized white light emitting diode 100b further includes a secondary optical unit 108 disposed on the second surface 107b of the transparent substrate 107. Wherein the secondary optical unit 108 is such as a flat sheet, a micro-lens, an optical film or an optical grating. In this embodiment, the secondary optical unit 108 is a micro-lens array, so the directivity of the polarized white light emitted from the polarized white light emitting diode 100b is improved by the micro-lens array.

Figure 5:
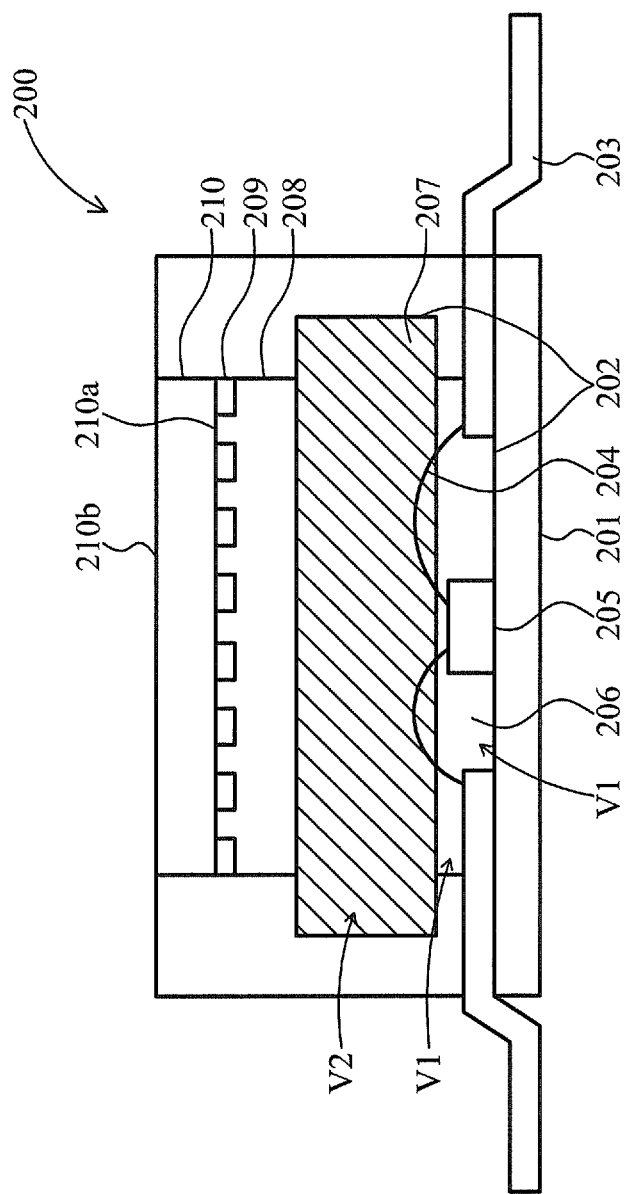
FIG. 5 is a schematic view of the polarized white light emitting diode of a fourth embodiment of the invention.

Refer to FIG. 5 for a schematic view of the polarized white light emitting diode of a fourth embodiment of the invention. The different structures between the polarized white light emitting diodes 100 and 200 are the dispositions of the reflection substrate, the light emitting diode and the phosphor layer. The polarized white light emitting diode 200 includes a reflection substrate 201, a light emitting diode chip 205, a transparent layer 206, a phosphor layer 207, a metallic wire-grid polarizing layer 209 and a transparent substrate 210.

The material of the reflection substrate 201 is such as Al, Si, porcelain, and etc.. The reflection substrate 201 has a first concave V1 and a second concave V2 connected with the first concave V1 by proper manufacture. The first concave V1 is disposed below the second concave V2, and a reflective layer 202 is formed on the surface of the first concave V1 and the second concave V2. The material of the reflective layer 202 is such as Al, W, Cu, Au, Ag and etc. for reflect the visible light. Two metallic pins 203 are formed apart on the reflection substrate 201 and penetrate through reflection substrate 201. The metallic pins 203 are electrically connected to the anode and the cathode of the light emitting diode 205 by the solder 204. The light emitting diode chip 205 is driven by external current through the metallic pins 203 to emit a first color light and further provide the first color light for exciting the phosphor layer 207. Wherein the first color light has a TE wave and a TM wave.

The light emitting diode chip 205 is disposed in the first concave V1. The transparent layer 206 covers and is spread around the light emitting diode chip 205 and the first concave V1 is filled with the transparent layer 206. The phosphor layer 207 covers the transparent layer 206 and is disposed in the second concave V2, so is around the reflection substrate 202. Due to the disposition of the transparent layer 206, the light emitting diode chip 205 not contacts the phosphor layer 207. In the operation of the polarized white light emitting diode 200, the thermal energy generated by the light emitting diode chip 205 could damage the phosphor layer 207, so the transparent layer 206 is to avoid the deterioration of the phosphor layer 207 and to make the efficiency and the quality sure.

In this embodiment, the blue light emitting diode chip is used as the light emitting diode chip 205, and YAG mixing with Ce is used as the yellow phosphor powder of the phosphor layer 207. The peak wavelength of the first color light is 458 nm of the blue light, and the peak wavelength of the second color light is 570 nm of the yellow light. The wire-grid period of the metallic wire-grid polarizing layer 209 is 288 nanometer. A non-polarized white light is formed by the mixing a portion of the blue light entering the phosphor layer 207 and the yellow light excited by another portion of the blue light. The blue light, which not excites the phosphor layer 207, enters the metallic wire-grid polarizing layer 209, then is reflected back to the phosphor layer 207 by the metallic wire-grid polarizing layer 209, so the phosphor layer 207 is excited to generate the yellow light with secondary excitation by the blue light from the metallic wire-grid polarizing layer 209. In the following, the non-polarized white light is formed by mixing the yellow light and the blue light. The transmission coefficient of the non-polarized white light is 60% of the transmission coefficient of the polarized white light, and the average extinction ratio of the metallic wire-grid polarizing layer 209 is 330. The metallic wire-grid polarizing layer 209 can improve the transmission coefficient of the polarized white light emitting diodes 200 and cause the polarization with multi-wavelengths and multi-angles.

Moreover, the metallic wire-grid polarizing layer 209 further limit the blue light, which is emitted from the blue light emitting diode chip 205, output from the polarized white light emitting diodes 200 too much, so as to stabilize the color of the polarized white light and to avoid the high color temperature caused by the blue light. The average color temperature of the polarized white light is only 60% of the average color temperature of the non-polarized white light.

Figure 6:
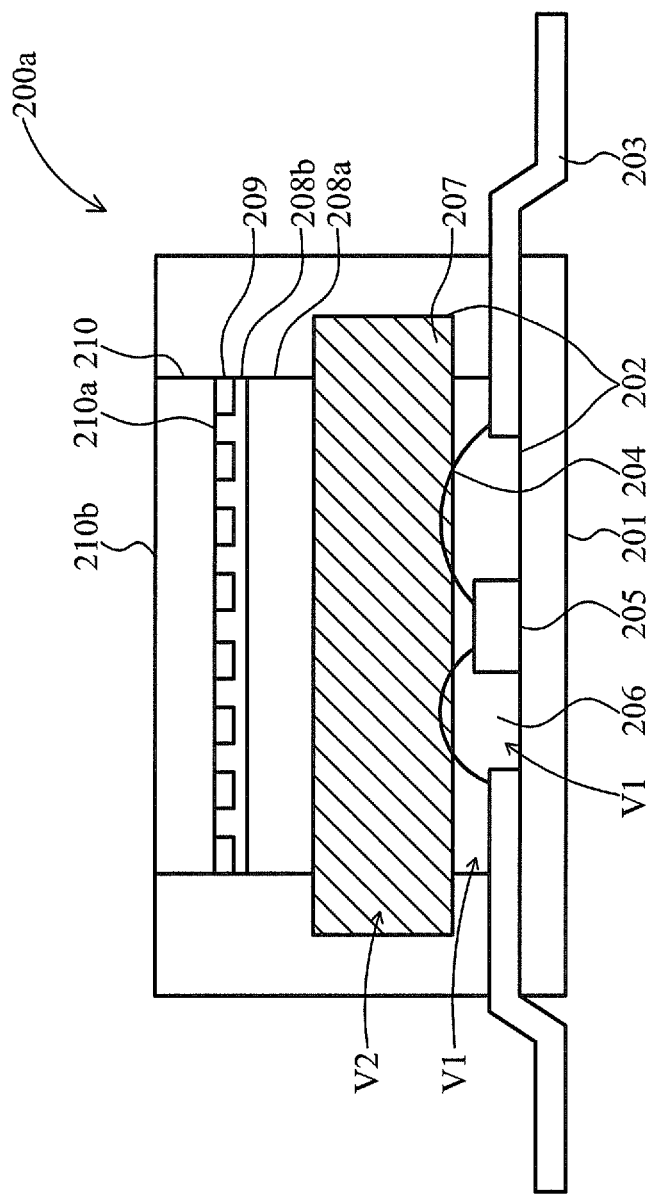
FIG. 6 is a schematic view of the polarized white light emitting diode of a fifth embodiment of the invention.

Refer to FIG. 6 for a schematic view of the polarized white light emitting diode of a fifth embodiment of the invention. The different structures between the polarized white light emitting diodes 200 and 200a is the air gap. The air gap 208 of the polarized white light emitting diodes 200 is replaced to an air gap 208b and a material 208a such as transparent gel in the polarized white light emitting diodes 200a. The reflective index of the medium 208a is between 1 and 1.4, and is smaller than the reflective index of the phosphor layer 104.

Figure 7:
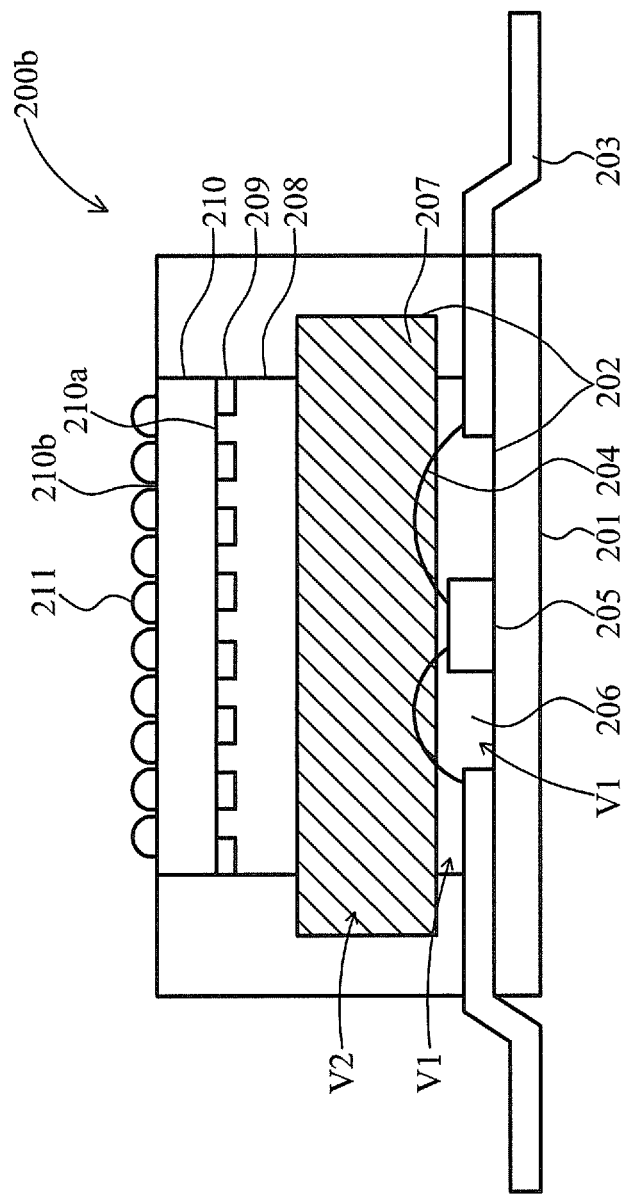
FIG. 7 is a schematic view of the polarized white light emitting diode of a sixth embodiment of the invention.

Refer to FIG. 7 for a schematic view of the polarized white light emitting diode of a sixth embodiment of the invention. A polarized white light emitting diode 200b further includes a secondary optical unit 211 disposed on the second surface 210b of the transparent substrate 210. Wherein the secondary optical unit 211 is such as a flat sheet, a micro-lens, an optical film or an optical grating. In this embodiment, the secondary optical unit 211 is a micro-lens array, so the directivity of the polarized white light emitted from the polarized white light emitting diode 200b is improved by the micro-lens array.

Above all, the polarized white light emitting diodes 100, 100a, 100b, 200, 200a and 200b use the blue light emitting diode chip emitting a blue light and the phosphor layer with the yellow phosphor powder excited by the blue light to generate a yellow light. A non-polarized white light is formed by mixing a portion of the blue light and the yellow light excited by another portion of the blue light, and then enters the metallic wire-grid polarizing layer to form a polarized white light, wherein the polarized white light is a TM wave. Because the metallic wire-grid polarizing layer is disposed above the phosphor layer, the blue light with the TE wave is reflected back to the air gap and the phosphor layer by the metallic wire-grid polarizing layer so as to produce secondary excitation and to generate a secondary non-polarized yellow light. The blue light with the TE wave is multiply reflected in plural directions by the metallic wire-grid polarizing layer between the phosphor layer and the air gap, and a secondary polarized white light transmits through the metallic wire-grid polarizing layer by mixing the blue light with the secondary non-polarized yellow light. Consequently, the polarized white light emitting diode can limit the output amount of the blue light so as to decrease the color temperature, and improve the transmission amount of the polarized white light and increase the extinction ratio. The blue light multiply reflected in plural directions can improve the uniform of the polarized white light emitting diode and solve the problem of the color variation caused by the color temperature.

By the partial reflection and the partial transmission of the metallic wire-grid polarizing layer, the non-polarized white light is converted into the polarized white light by the polarization randomization.

Moreover, the polarized white light emitting diode of the invention includes several advantages as below.

1. For avoiding the nanometer structure of the metallic wires of the metallic wire-grid polarizing layer damage, and for increasing the extinction ratio and the durable level of the polarized white light emitting diode, the metallic wire-grid polarizing layer faces downward to the phosphor layer and not contacts the phosphor layer with the air gap.

2. The metallic wire-grid polarizing layer has a character of heat-resistant, so is hard-damaged because of long time usage and the contact.

3. The portion of the first color light is multiply reflected in plural directions by the metallic wire-grid polarizing layer between the phosphor layer and the air gap, and the second color light is repeatedly excited by the first color light. Consequently, the illumination and the uniform of the polarized white emitting diode is improved, the deterioration caused by heat is solved, and the color shift is retarded.

4. By the disposition of the metallic wire-grid polarizing layer, the polarized white light emitting diode is used as the light source of the back-lighting device of the LCD, so as to reduce the usage of the polarizing sheets.

5. In illumination application, the polarized light emitted from the polarized white light emitting diode decreases glare so user feels comfortable as reading.

6. Further add a secondary optical unit such as a flat sheet, a micro-lens, an optical film or an optical grating on the polarized white light emitting diode, so the polarized white light emitting diode is in widespread use.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A polarized white light emitting diode comprising:
  a reflection substrate;
  a transparent substrate having a first surface and a second surface opposing the first surface;
  a metallic wire-grid polarizing layer disposed under the transparent substrate and in contact therewith, wherein the metallic wire-grid polarizing layer and the reflection substrate form a cavity;
  a light emitting diode chip, disposed in the cavity, for providing a first color light; and
  a phosphor layer, covering over and around the LED chip, disposed in the cavity with an air gap between the phosphor layer and the metallic wire-grid polarizing layer, wherein a second color light is generated by the phosphor layer excited with the first color light,
  wherein the metallic wire-grid polarizing layer multiply reflects a portion of the first color light in plural directions in the cavity to produce secondary excitations; a polarized white light transmits through the metallic wire-grid polarizing layer by mixing another portion of the first color light and the second color light excited by the first color light; and the polarized white light is transmitted through the second surface of the transparent substrate;
  wherein the first color light includes a transverse magnetic wave and a transverse electric wave, the transverse electric wave is multiply reflected in plural directions by the metallic wire-grid polarizing layer between the phosphor layer and the air gap, and the polarized white light transmits through the metallic wire-grid polarizing layer by mixing the transverse magnetic wave with the second color light excited by the first color light; and wherein the reflection substrate has a first concave, a second concave connected with the first concave and a transparent layer, the first concave is disposed below the second concave, the light emitting diode chip is disposed in the first concave, the transparent layer is spread around the light emitting diode chip and the first concave is filled with the transparent layer, the phosphor layer covers the transparent layer and is disposed in the second concave, and the transverse electric wave is multiply reflected in the cavity.

2. The polarized white light emitting diode of claim 1 further comprising a secondary optical unit disposed on the second surface of the transparent substrate.

3. The polarized white light emitting diode of claim 1, wherein the reflection substrate has a bottom and four walls, a concave is formed by the bottom and the walls, the light emitting diode chip is disposed above the bottom, the phosphor layer covers the light emitting diode chip and is disposed in the concave, and the transverse electric wave is multiply reflected in the cavity.

4. The polarized white light emitting diode of claim 1, wherein the phosphor layer is formed by mixing a transparent glue with at least one phosphor powder, and the phosphor powder is a yellow phosphor powder.

5. The polarized white light emitting diode of claim 1, wherein the air gap includes a medium, the reflective index of the medium is between 1 and 1.4, and is smaller than the reflective index of the phosphor layer.

6. The polarized white light emitting diode of claim 1, wherein the metallic wire-grid polarizing layer and the transparent substrate are integrated.

7. The polarized white light emitting diode of claim 6, wherein the metallic wire-grid polarizing layer includes plural metallic wires, the metallic wires are parallel disposed on the first surface of the transparent substrate, the metallic wire-grid polarizing layer has a wire-grid period, and the wire-grid period is smaller than or equal to the 300 nanometer.

8. The polarized white light emitting diode of claim 6, wherein the metallic wire-grid polarizing layer has a duty cycle ratio, and the duty cycle ratio is between 10% and 60%.

9. A polarized white light emitting diode comprising:
a reflection substrate;
a transparent substrate having a first surface and a second surface opposing the first surface;
a metallic wire-grid polarizing layer disposed under the transparent substrate and in contact therewith, wherein the metallic wire-grid polarizing layer and the reflection substrate form a cavity;
a light emitting diode chip, disposed in the cavity, for providing a first color light; and
a phosphor layer, covering over and around the LED chip, disposed in the cavity with an air gap between the phosphor layer and the metallic wire-grid polarizing layer, wherein a second color light is generated by the phosphor layer excited with the first color light,
wherein the metallic wire-grid polarizing layer multiply reflects a portion of the first color light in plural directions in the cavity to produce secondary excitations; a polarized white light transmits through the metallic wire-grid polarizing layer by mixing another portion of the first color light and the second color light excited by the first color light; and the polarized white light is transmitted through the second surface of the transparent substrate; and wherein the air gap includes a medium, the reflective index of the medium is between 1 and 1.4, and is smaller than the reflective index of the phosphor layer.

10. The polarized white light emitting diode of claim 9 further comprising a secondary optical unit disposed on the second surface of the transparent substrate.

11. The polarized white light emitting diode of claim 9, wherein the first color light includes a transverse magnetic wave and a transverse electric wave, the transverse electric wave is multiply reflected in plural directions by the metallic wire-grid polarizing layer between the phosphor layer and the air gap, and the polarized white light transmits through the metallic wire-grid polarizing layer by mixing the transverse magnetic wave with the second color light excited by the first color light.

12. The polarized white light emitting diode of claim 11, wherein the reflection substrate has a bottom and four walls, a concave is formed by the bottom and the walls, the light emitting diode chip is disposed above the bottom, the phosphor layer covers the light emitting diode chip and is disposed in the concave, and the transverse electric wave is multiply reflected in the cavity.

13. The polarized white light emitting diode of claim 11, wherein the reflection substrate has a first concave, a second concave connected with the first concave and a transparent layer, the first concave is disposed below the second concave, the light emitting diode chip is disposed in the first concave, the transparent layer is spread around the light emitting diode chip and the first concave is filled with the transparent layer, the phosphor layer covers the transparent layer and is disposed in the second concave, and the transverse electric wave is multiply reflected in the cavity.

14. The polarized white light emitting diode of claim 9, wherein the phosphor layer is formed by mixing a transparent glue with at least one phosphor powder, and the phosphor powder is a yellow phosphor powder.

15. The polarized white light emitting diode of claim 9, wherein the air gap includes a medium, the reflective index of the medium is between 1 and 1.4, and is smaller than the reflective index of the phosphor layer.

16. The polarized white light emitting diode of claim 9, wherein the metallic wire-grid polarizing layer and the transparent substrate are integrated.

17. The polarized white light emitting diode of claim 16, wherein the metallic wire-grid polarizing layer includes plural metallic wires, the metallic wires are parallel disposed on the first surface of the transparent substrate, the metallic wire-grid polarizing layer has a wire-grid period, and the wire-grid period is smaller than or equal to the 300 nanometer.

18. The polarized white light emitting diode of claim 16, wherein the metallic wire-grid polarizing layer has a duty cycle ratio, and the duty cycle ratio is between 10% and 60%.

* * * * *